(12) United States Patent
Ochiai et al.

(10) Patent No.: US 9,389,472 B2
(45) Date of Patent: Jul. 12, 2016

(54) DISPLAY DEVICE

(71) Applicant: Japan Display Inc., Tokyo (JP)

(72) Inventors: Takahiro Ochiai, Chiba (JP); Mitsuru Goto, Chiba (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/493,780

(22) Filed: Sep. 23, 2014

(65) Prior Publication Data

US 2015/0009464 A1 Jan. 8, 2015

Related U.S. Application Data

(63) Continuation of application No. 13/396,815, filed on Feb. 15, 2012, now Pat. No. 8,854,590.

(30) Foreign Application Priority Data

Feb. 21, 2011 (JP) .................... 2011-034805

(51) Int. Cl.
  *G02F 1/1345* (2006.01)
  *G02F 1/1333* (2006.01)
  *G02F 1/13* (2006.01)
  *H01L 23/00* (2006.01)
  *G02F 1/1368* (2006.01)
  *G02F 1/1362* (2006.01)

(52) U.S. Cl.
  CPC .......... *G02F 1/13452* (2013.01); *G02F 1/1368* (2013.01); *G02F 1/13458* (2013.01); *G02F 1/133345* (2013.01); *H01L 24/05* (2013.01); *H01L 24/06* (2013.01); *G02F 2001/136254* (2013.01)

(58) Field of Classification Search
  CPC ............ G02F 1/13458; G02F 1/13452; G02F 1/1345; G02F 1/133345; G02F 2001/136254; H01L 24/05; H01L 24/06
  USPC .......... 349/149–152, 40, 54, 192; 345/80, 90, 345/32, 104; 348/790, E3.016
  See application file for complete search history.

(56) References Cited

U.S. PATENT DOCUMENTS 5,900,643 A 5/1999 Preslar et al.
6,429,057 B1 8/2002 Hong et al.
(Continued)

FOREIGN PATENT DOCUMENTS

JP 2004-333673 11/2004

*Primary Examiner* — Michael Caley
*Assistant Examiner* — Jia Pan
(74) *Attorney, Agent, or Firm* — TYPHA IP LLC

(57) ABSTRACT

A display device includes a transparent substrate having a display region with a plurality of scanning signal lines and video signal lines intersecting thereon, a first terminal formed outside the display region connecting to a first terminal wiring and a second terminal wiring connected to a semiconductor chip, and an inverted staggered thin film transistor. The first terminal includes a first portion, a second portion on the first portion, a third portion having an exposed planar terminal plate on the second portion, a plurality of first vias between the first portion and the second portion, and a plurality of second vias between the second portion and the third portion. The first portion is connected to the first and second terminal wirings, and each of the plurality of first vias is not overlapped with each of the plurality of second vias in plan view.

8 Claims, 14 Drawing Sheets

(56) References Cited

U.S. PATENT DOCUMENTS

| | | |
|---|---|---|
| 7,057,296 B2 | 6/2006 | Hung et al. |
| 7,168,863 B2 | 1/2007 | Yajima |
| 7,202,930 B2 | 4/2007 | Woo et al. |
| 7,342,353 B2 | 3/2008 | Ochiai et al. |
| 7,671,958 B2 | 3/2010 | Fujita |
| 7,768,586 B2 | 8/2010 | Cho et al. |
| 8,183,698 B2 | 5/2012 | Antol et al. |
| 2002/0071086 A1 | 6/2002 | Kim et al. |
| 2004/0252269 A1* | 12/2004 | Murade ............... G02F 1/1345 349/149 |
| 2006/0131759 A1* | 6/2006 | Hung ..................... H01L 24/05 257/786 |
| 2007/0035688 A1* | 2/2007 | Matsuura ........... G02F 1/13452 349/149 |
| 2007/0195215 A1* | 8/2007 | Murade ............... G02F 1/1345 349/42 |
| 2008/0204618 A1 | 8/2008 | Jung et al. |
| 2009/0153008 A1 | 6/2009 | Yanagisawa et al. |
| 2010/0201000 A1 | 8/2010 | Antol et al. |

* cited by examiner

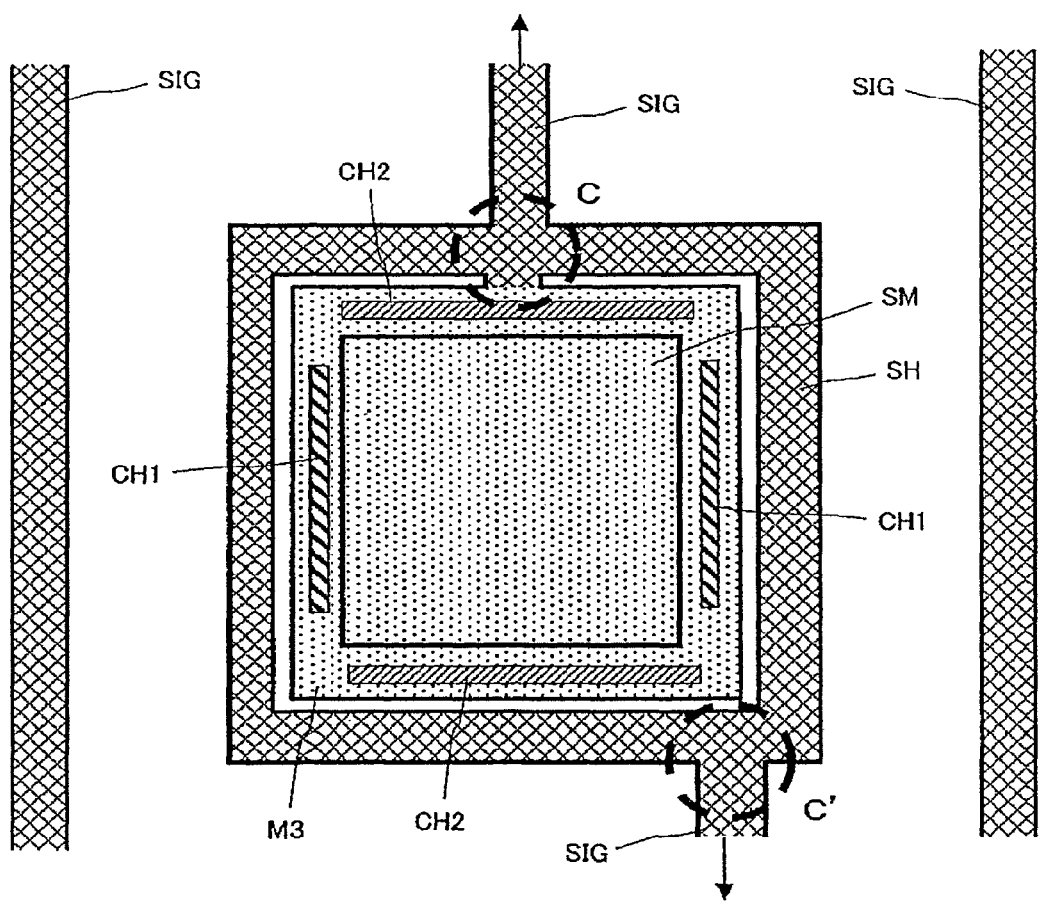

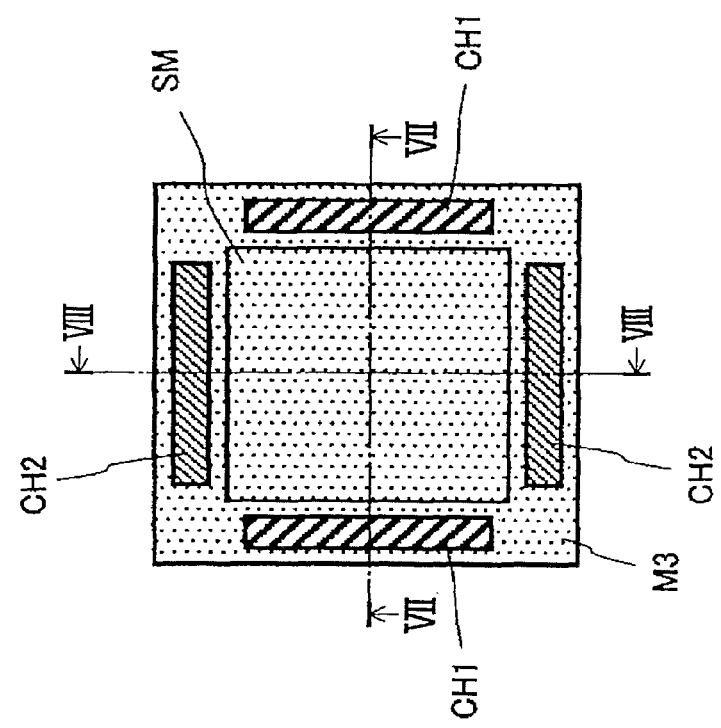
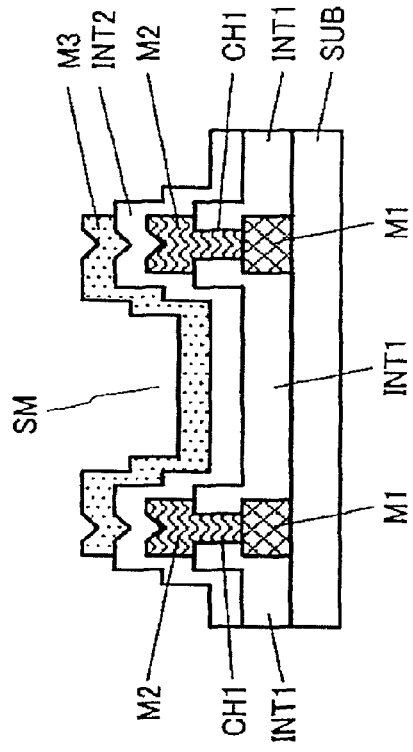
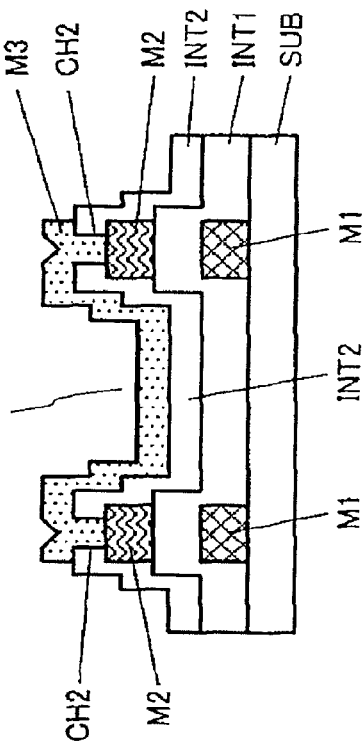

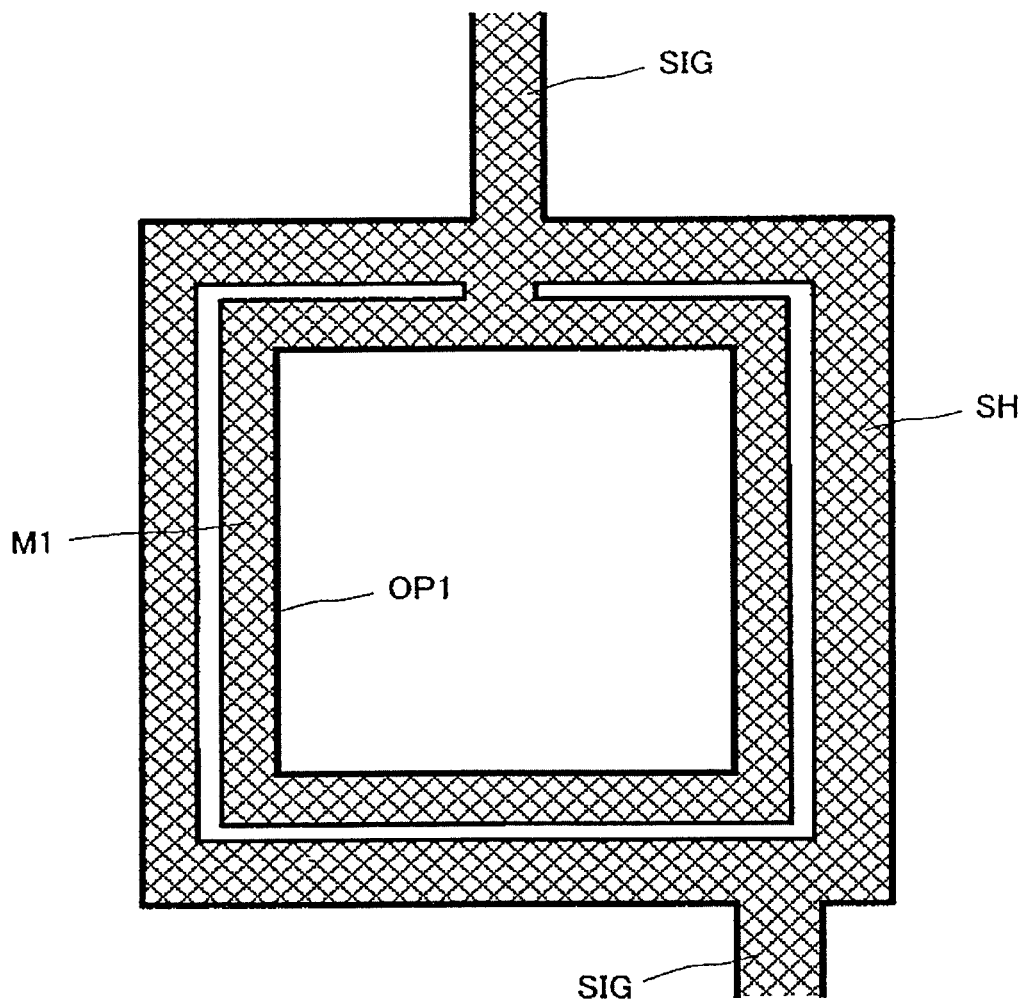

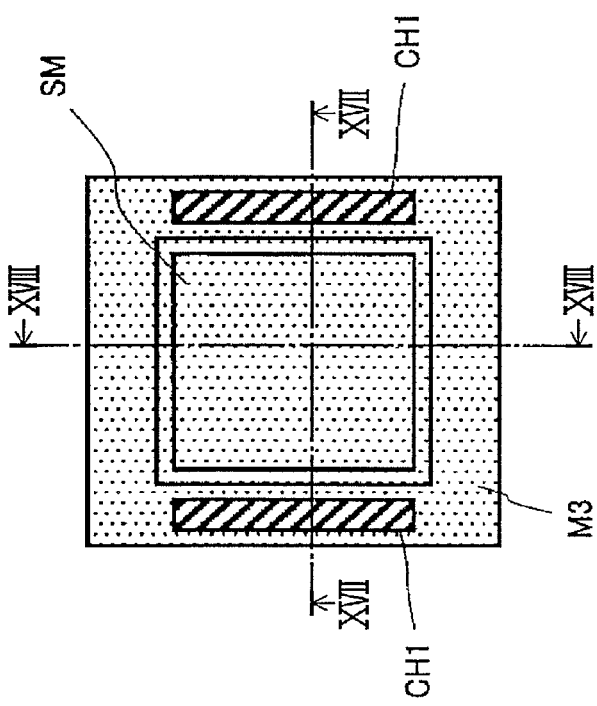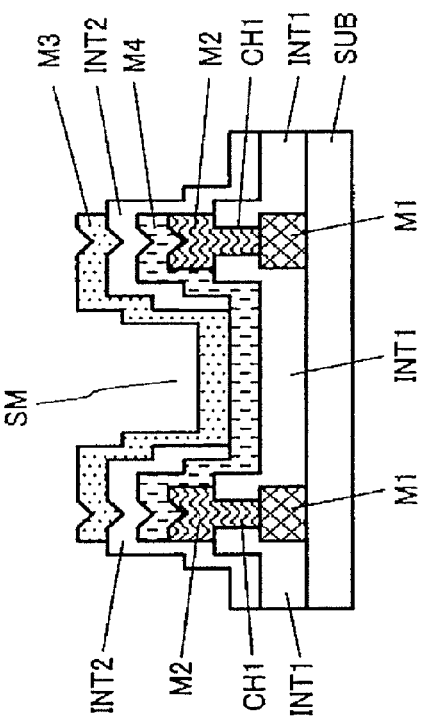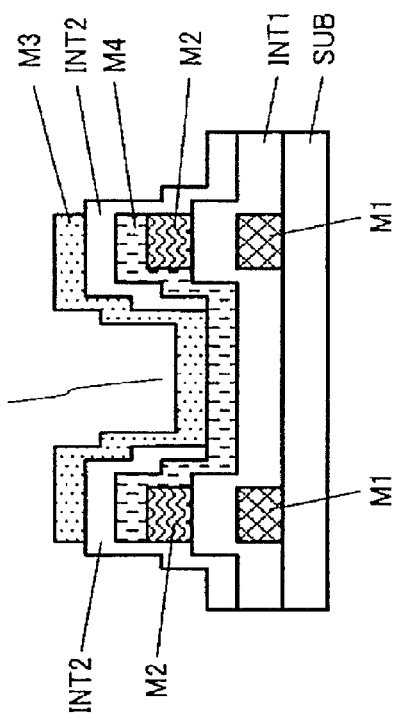

DISPLAY DEVICE

CROSS-REFERENCE TO RELATED APPLICATION

This application is a continuation application of U.S. application Ser. No. 13/396,815, filed Feb. 15, 2012, the contents of which are incorporated herein by reference.

The present application claims priority from Japanese application JP 2011-034805 filed on Feb. 21, 2011, the contents of which are hereby incorporated by reference into this application.

BACKGROUND OF THE INVENTION

1. Field of the Invention

The present invention relates to a display device, and more particularly, to a terminal portion for inputting a signal from outside.

2. Description of the Related Art

In a liquid crystal display device, on a surface of one substrate of a pair of substrates arranged so as to be opposed to each other while sandwiching liquid crystal, the surface being on the liquid crystal side, there are formed gate lines (scanning signal lines) extending in an X direction and arranged in parallel to one another in a Y direction, and drain lines (video signal lines) extending in the Y direction and arranged in parallel to one another in the X direction. Rectangular regions surrounded by the respective signal lines are formed as pixel regions. A display region is formed of a mass of those respective pixels. Each of the pixels includes at least a thin film transistor which is turned ON in response to a scanning signal from the gate line, and a pixel electrode to be supplied with a video signal from the drain line via the thin film transistor in the ON state. Those gate line and drain line are each connected to one end of terminal wiring (extraction wiring) at an end portion of the display region, and are each electrically connected to a terminal called a pad formed at another end of the terminal wiring. The terminal wiring is arranged in a periphery region excluding the display region, and the terminals are arranged at a side portion of the one substrate.

In each of those terminals, for example, as described in Japanese Patent Application Laid-open No. 2004-333673, an opening portion having a width smaller than that of the terminal wiring is formed in a part of an insulating film arranged on the terminal wiring, and a conductive layer corresponding to the opening portion is formed. Thus, the conductive layer and the terminal wiring are electrically connected to each other. In this case, in a region in which the conductive layer is to be arranged, there are formed two grooves (elongated holes), from which an insulating film provided below is exposed, at side portions of the terminal wiring along an extension direction of the terminal wiring. The conductive layer is formed only on a region of the terminal wiring sandwiched between the two elongated holes, and the insulating film is formed on the terminal wiring arranged on both sides of the elongated holes.

In the terminal portion having such a structure, the terminal is connected to the drain line via the terminal wiring, and the drain line is connected to a drain electrode of each thin film transistor. Meanwhile, the terminal wiring extended from the terminal toward another end is electrically connected to a wiring layer CL arranged in the vicinity of a side edge portion of the substrate. Similarly, the respective terminals are connected to the same wiring layer CL, and thus all the terminals are short-circuited. The wiring layer CL is cut off when the glass substrate is cut. With this, the respective terminals are not short-circuited, that is, the terminals are electrically separated from one another.

Meanwhile, there is known a display device in which, on a part of a region outside the display region, a lighting inspection circuit for inspecting disconnection of the gate line or the drain line and the like is formed. For example, the lighting inspection circuit includes an inspection thin film transistor formed at end portions of the gate line and the drain line, which are not connected to the terminal wiring, an inspection signal line for turning ON the inspection thin film transistor, and an inspection signal line for supplying an inspection signal to the gate line or the drain line via the inspection thin film transistor in the ON state. Those inspection signal lines are also arranged in the periphery region excluding the display region together with the terminal wiring, and a terminal for inputting the inspection signal is also arranged in the side portion of the one substrate together with the terminal of the terminal wiring.

In the inspection of the liquid crystal display panel with use of this lighting inspection circuit, the inspection signal is input from the inspection terminal after the liquid crystal display panel is cut, thereby inspecting lighting and extinction of respective pixels aligned in matrix inside the display region.

That is, the inspection terminal is used only when the inspection signal is input from outside, and after the inspection is finished, only the inspection signal lines are used. That is, the conventional liquid crystal display panel includes wiring which is used as the terminal wiring during ordinary use after the inspection is finished and is used as the inspection signal lines during inspection. Only in this inspection wiring, the terminal portion is formed in the middle of the wiring, and during ordinary use, the terminal portion is not used.

However, as described above, the upper layer of the terminal portion is formed only of a conductive layer so as to input the inspection signal from the outside, and is not covered with an insulating film similarly to other signal line portions. Further, unlike terminal portions of other terminal wiring, a drive circuit, a flexible printed circuit board, and the like are not connected to the terminal portion. Therefore, when the liquid crystal display panel is used in, for example, a high-temperature and high-humidity environment, a portion exposed from the insulating film, such as the conductive layer formed on the terminal wiring, is subjected to corrosion due to a mutual action of moisture in the air and an electric field applied to the conductive layer. Due to the progress of this corrosion, the terminal wiring formed under the conductive layer may also be affected, and hence there is a fear that the terminal wiring is disconnected.

SUMMARY OF THE INVENTION

The present invention has been made in view of the above-mentioned problems, and therefore has an object to provide a technology capable of improving reliability of a terminal for inputting a signal to a display device.

In order to solve the above-mentioned problems, the present invention provides a display device including: a display region in which a plurality of scanning signal lines and a plurality of video signal lines intersecting the plurality of scanning signal lines are formed; and a terminal group including a plurality of terminals for supplying a signal to one of the plurality of scanning signal lines and the plurality of video signal lines via first terminal wiring, the terminal group being formed outside the display region, in which: each of the plurality of terminals includes: a first portion, which is formed at an end portion of the first terminal wiring, the first portion having an exposed planar terminal surface; and a second portion, which is provided adjacent to the first portion and is formed around the first portion; and the second portion is formed of one of a conductive thin film covered with an insulating film and formed in the same layer as the first terminal wiring and a conductive thin film covered with an insulating film and formed in a different layer from the first terminal wiring, the second portion being electrically connected to the first terminal wiring at a position spaced apart from a connection portion of the first terminal wiring and the first portion.

According to the present invention, it is possible to improve the reliability of the terminal for inputting the signal to the display device.

Other effects of the present invention are made apparent from the description of the entire specification.

BRIEF DESCRIPTION OF THE DRAWINGS

In the accompanying drawings:

FIG. 4 is an enlarged view of a terminal portion, illustrating a detailed structure of a terminal of the liquid crystal display device according to the first embodiment of the present invention;

FIG. 6 is a plan view illustrating a detailed structure of a pad portion of the liquid crystal display device according to the first embodiment of the present invention;

FIG. 7 is a sectional view taken along the line VII-VII illustrated in FIG. 6;

FIG. 8 is a sectional view taken along the line VIII-VIII illustrated in FIG. 6;

FIG. 9 is a view illustrating a schematic structure of a first conductive thin film forming the terminal of the first embodiment of the present invention;

FIG. 16 is a view illustrating a detailed structure of a pad portion of the fourth embodiment of the present invention;

FIG. 17 is a sectional view taken along the line XVII-XVII illustrated in FIG. 16;

FIG. 18 is a sectional view taken along the line XVIII-XVIII illustrated in FIG. 16;

DETAILED DESCRIPTION OF THE INVENTION

Hereinafter, embodiments to which the present invention is applied are described with reference to the drawings. Note that, in the following description, the same components are denoted by the same reference symbols, and overlapping description thereof is omitted.

[First Embodiment]
[Entire Structure]

Figure 1:
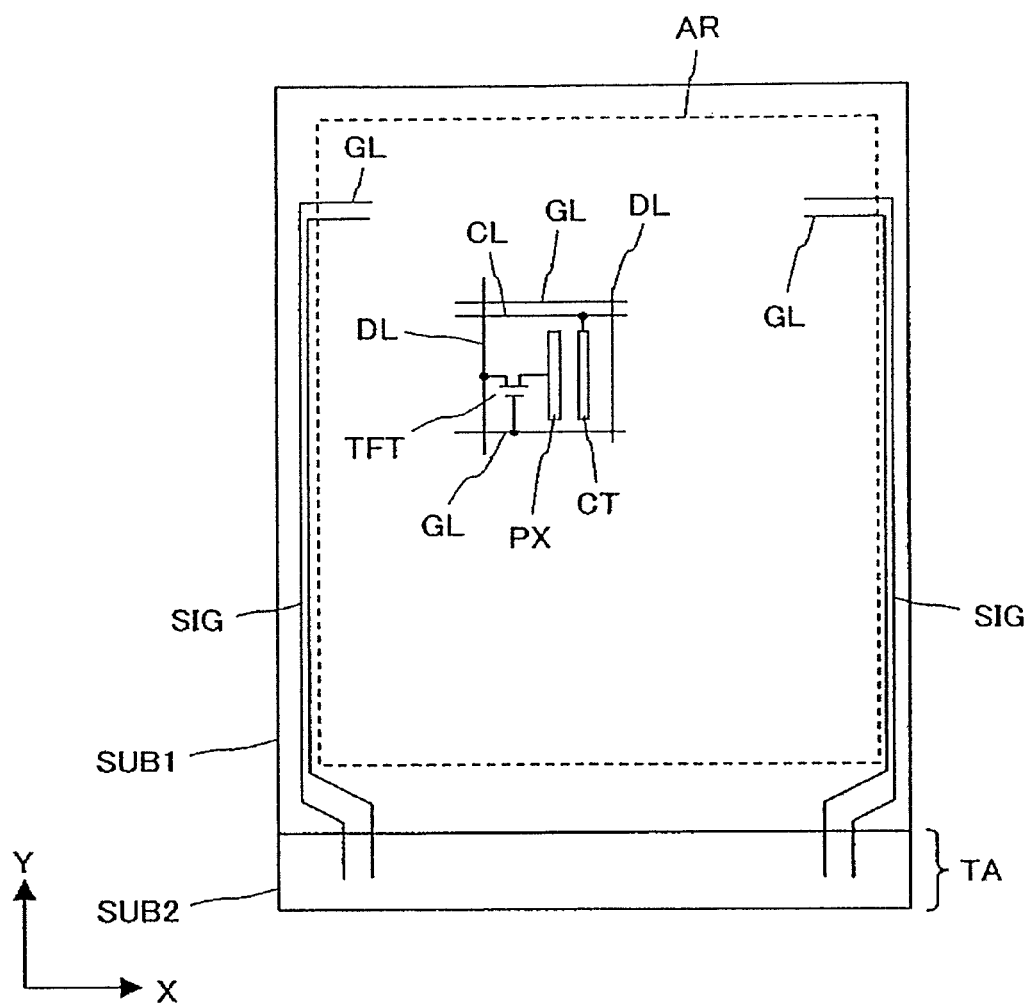
FIG. 1 is a plan view illustrating an entire structure of a liquid crystal display device corresponding to a display device according to a first embodiment of the present invention.

FIG. 1 is a plan view illustrating an entire structure of a liquid crystal display device corresponding to a display device according to a first embodiment of the present invention. Hereinafter, with reference to FIG. 1, the entire structure of the display device of the first embodiment is described. Note that, in the following, description is made of a case where the invention of this application is applied to a liquid crystal display device, which is a non-emissive display device, but the present invention is not limited thereto. The present invention is also applicable to other display devices such as self-emissive organic EL display devices. Further, in the following, description is made of a case where the invention of this application is applied to an inspection terminal QD for inputting an inspection signal to a known lighting inspection circuit (not shown). However, the present invention is also applicable to other terminals such as a terminal to which an input/output terminal of a drive circuit is connected or a terminal connected to a flexible printed circuit board. Note that, the invention of this application is most effective when being applied to the inspection terminal whose terminal surface is exposed after factory shipment, that is, during ordinary use.

As illustrated in FIG. 1, the liquid crystal display device of the first embodiment includes a liquid crystal display panel including: a first substrate SUB1, which has a pixel electrode PX, a thin film transistor TFT, and the like formed thereon; a second substrate SUB2, which has a color filter (not shown) and a black matrix (not shown) formed thereon and is arranged so as to be opposed to the first substrate SUB1; and a liquid crystal layer (not shown) sandwiched between the first substrate SUB1 and the second substrate SUB2. The liquid crystal display panel is combined with a backlight unit (backlight device) (not shown) as a light source for illuminating the liquid crystal display panel, and thus the liquid crystal display device is constructed.

Fixing of the first substrate SUB1 and the second substrate SUB2 and sealing of liquid crystal are performed by using a sealing member (not shown), which is applied in an annular shape at a peripheral portion of the second substrate. Further, the second substrate SUB2 has an area smaller than that of the first substrate SUB1, and hence a side portion of the first substrate SUB1 on the lower side in FIG. 1 is exposed. Onto the side portion (terminal region TA) of the first substrate SUB1, there are formed, for example, the inspection terminal QD and the terminal to which the output terminal of the drive circuit, which is formed of a semiconductor chip, is connected. Each pixel arranged in a display region AR is driven by a drive signal (scanning signal, video signal, and the like) to be input via a terminal. Note that, in the following description, even in the description of the liquid crystal display panel, the liquid crystal display panel is occasionally described as the "liquid crystal display device".

Further, in the liquid crystal display device of the first embodiment, a region in which display pixels (hereinafter, abbreviated as pixels) are formed within a region in which the liquid crystal is sealed corresponds to the display region AR. Therefore, even within the region in which the liquid crystal is sealed, a region in which pixels are not formed and which is not related to display does not correspond to the display region AR. Note that, as for the first substrate SUB1 and the second substrate SUB2, for example, a known glass substrate is generally used as a base member. However, the substrate to be used is not limited to a glass substrate, and may be other insulating substrates such as a quartz glass and plastic (resin).

In the liquid crystal display device of the first embodiment, gate lines (scanning signal lines) GL are formed on a surface of the first substrate SUB1 on the liquid crystal side within the display region AR, the gate lines GL extending in an X-direction and being arranged in parallel to one another in a Y-direction in FIG. 1. The gate lines GL are supplied with a scanning signal from a drive circuit DR. Further, drain lines (video signal lines) DL extending in the Y-direction and being arranged in parallel to one another in the X-direction in FIG. 1 are formed. The drain lines DL are supplied with a video signal (gradation signal) from the drive circuit. Those gate lines GL and drain lines DL are formed of a metal thin film made of, for example, aluminum, but may be formed of a conductive film made of other conductive materials. A rectangular region surrounded by the gate lines GL and the drain lines DL forms a region in which the pixel is formed (hereinafter, referred to as pixel region). In this manner, the respective pixels are arranged in matrix within the display region AR.

Each of the pixels includes the thin film transistor TFT which is ON/OFF driven by the scanning signal from the gate line GL, the pixel electrode PX which is supplied with the video signal from the drain line DL via the thin film transistor TFT in the ON state, and a common electrode CT which is formed on at least the entire surface of the display region, and is supplied with a common signal having a potential which becomes a reference with respect to a potential of the video signal, the common signal being supplied from one end or both ends on right and left sides in the X-direction (end portions of the first substrate SUB1) via a common line CL. Note that, the thin film transistor TFT is a so-called inverted staggered thin film transistor. The inverted staggered thin film transistor is driven in such a manner that a drain electrode and a source electrode switch places depending on the bias application thereto, but in this specification, for the sake of convenience, an electrode connected to the video signal line DL is represented as a drain electrode DT, and an electrode connected to the pixel electrode PX is represented as a source electrode ST.

An electric field having a component parallel to a main surface of the first substrate SUB1 is generated between the pixel electrode PX and the common electrode CT. The molecules of the liquid crystal are driven by this electric field. Such a liquid crystal display device is known as a liquid crystal display device capable of performing so-called wide viewing angle display. Because of the specificity of the electric field application to the liquid crystal, such type of the liquid crystal display device is called an in-plane switching (IPS) type or a lateral electric field type. Further, in the liquid crystal display device having such a structure, the display is performed in a normally black display mode, in which when an electric field is not applied to the liquid crystal, light transmittance ratio is minimum (black display), and the light transmittance ratio increases through application of the electric field. Note that, liquid crystal display devices of other driving types, such as a twisted nematic (TN) type or a vertical alignment (VA) type, may be used.

Each of the gate lines GL and the drain lines DL extends beyond the display region AR, and is connected to a terminal formed in the terminal region TA of the first substrate SUB1 via terminal wiring SIG formed in a so-called frame region, which is a region provided between the display region AR and a side edge portion of the first substrate SUB1. Note that, in the following description, even when the gate line GL or the drain line DL and the terminal wiring SIG are formed in the same layer in the same step, a signal line formed in the frame region is described as the terminal wiring SIG. Further, in the following, description is made of a case where a metal thin film is used as the terminal wiring SIG, but the terminal wiring SIG may be formed of other conductive thin films.

Figure 2:
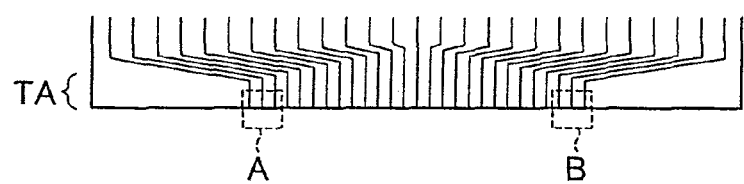
FIG. 2 is a pattern view of a terminal region of the liquid crystal display device according to the first embodiment of the present invention.
Figure 3A:
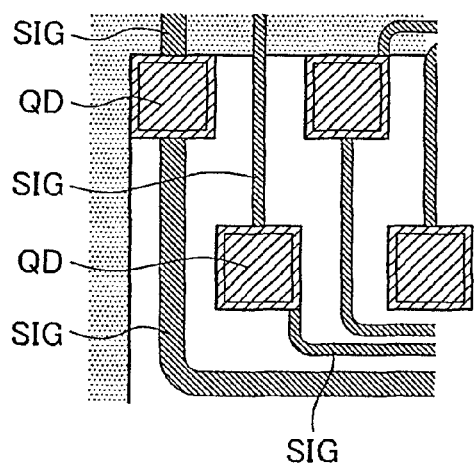
FIGS. 3A and 3B are enlarged views of regions indicated by rectangular frames A and B illustrated in FIG. 2.
Figure 3B:
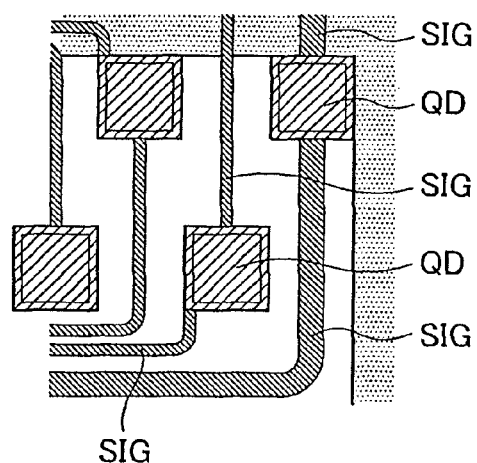

FIG. 2 is a pattern view of the terminal region of the liquid crystal display device according to the first embodiment of the present invention, and FIGS. 3A and 3B are enlarged views of regions indicated by rectangular frames A and B illustrated in FIG. 2. Specifically, FIG. 3A is an enlarged view of the rectangular frame A illustrated in FIG. 2, and FIG. 3B is an enlarged view of the rectangular frame B illustrated in FIG. 2.

As illustrated in FIG. 2, the inspection terminals QD are arranged on both sides of the terminal region TA, and are each formed to have a terminal area larger than that of other terminals. This is because, when a signal is input to the inspection terminal QD from outside, an inspection probe pin is brought into abutment against the terminal QD, to thereby input a desired inspection signal to the terminal QD via the probe pin. With such a structure, for example, inspection can be performed before mounting relatively expensive module members, such as the drive circuit and the flexible printed circuit board, onto the liquid crystal display panel. In this manner, it is possible to reduce the number of steps (time) required for mounting the module members onto a defective liquid crystal display panel, and reduce the number of steps required for detaching the mounted module members to reuse the module members.

Further, the terminal QD of the first embodiment is formed in the middle of the wiring SIG, and when the inspection signal is not input, that is, during ordinary display operation, a display drive signal input from another terminal and the like are conducted. Still further, in the liquid crystal display device of the first embodiment, the outer shape of the inspection terminal QD is formed into a square shape, and terminals QD adjacent thereto are formed so as to be shifted in a vertical direction in FIGS. 3A and 3B within the terminal region TA of the first substrate SUB1.

As is clear from FIGS. 3A and 3B, in the liquid crystal display device of the first embodiment, depending on the signal to be input to the terminal QD, a wiring width of the terminal wiring (hereinafter, simply referred to as wiring) SIG connected to the terminal QD is different. For example, in the wiring SIG involved with a power source, a common signal line, and the like, in order to decrease a voltage drop due to a wiring resistance, the width of the wiring SIG is formed large. For example, the terminal QD connected to such wiring SIG may be formed so that a wiring width of a shielding line to be described in detail later is formed wider (larger) than a width of a shielding line of other terminals QD. This is because, as described above, by increasing the width of the shielding line, it is possible to reduce the resistance of the shielding line also functioning as the signal line.

Further, the terminal QD is formed in the middle of the wiring SIG, but as described in detail later, a pad portion to be brought into abutment against the inspection probe pin and signal lines (shielding lines) electrically connected to upper and lower lines of the wiring SIG in FIGS. 3A and 3B, the upper and lower lines being arranged via the terminal QD, are formed of different components.

<Detailed Structure of Terminal Portion>

Figure 5:
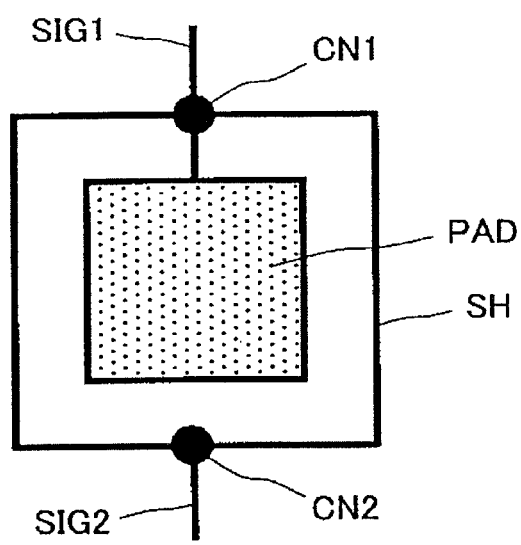
FIG. 5 is a schematic view illustrating the detailed structure of the terminal of the liquid crystal display device according to the first embodiment of the present invention.

FIG. 4 is an enlarged view of the terminal portion, illustrating a detailed structure of the terminal of the liquid crystal display device according to the first embodiment of the present invention, and FIG. 5 is a schematic view illustrating the detailed structure of the terminal of the liquid crystal display device according to the first embodiment of the present invention. Hereinafter, with reference to FIGS. 4 and 5, the structure of the terminal of the first embodiment is described in detail. Note that, in FIG. 4, in order to clarify positions of a pad electrode M3 and contact holes CH1 and CH2, which are formed below the pad electrode M3, the contact holes CH1 and CH2 are illustrated so as to superimpose the pad electrode M3. Further, in the following description, a part of the terminal wiring SIG formed on the upper side with respect to the terminal (pad electrode M3) in FIG. 5 is represented by wiring SIG1, and a part of the terminal wiring SIG formed on the lower side with respect to the terminal in FIG. 5 is represented by wiring SIG2. Further, description is made of a case where a shielding line SH forming the terminal QD and the wiring SIG are formed of a metal thin film in the same layer, but the present invention is not limited thereto. The shielding line SH and the wiring SIG may be formed of conductive films formed in different layers.

As illustrated in FIGS. 4 and 5, the terminal QD of the first embodiment includes, in plan view, a pad portion (first portion) PAD including the pad electrode (third electrode) M3, which is formed into a rectangular shape and is exposed from the substrate surface, and the shielding line (second portion) SH formed into an annular shape (square and annular shape) so as to surround an outer periphery of the pad portion PAD. In this case, in the terminal QD of the first embodiment, the wiring SIG and the shielding line SH are formed of a conductive metal thin film formed in the same layer. At a position indicated by a circle C in FIG. 4 (corresponding to a connection portion CN1 illustrated in FIG. 5), the wiring SIG1 extending upward in FIG. 4 and the shielding line SH are electrically connected to each other. Further, at a position indicated by a circle C' in FIG. 4 (corresponding to a connection portion CN2 illustrated in FIG. 5), the wiring SIG2 extending downward in FIG. 4 and the shielding line SH are connected to each other. As described above, in the terminal QD of the first embodiment, the wiring SIG1 and the wiring SIG2 are electrically connected to each other via the shielding line SH formed so as to surround the pad portion PAD in an annular (square and annular) manner.

Meanwhile, the pad electrode M3 exposed on the upper surface of the pad portion PAD is electrically connected to the wiring SIG1 via the contact holes (connection holes) CH1 and CH2 formed in an insulating film described in detail later. Further, the pad electrode M3 is made of, for example, an indium oxide based material such as indium tin oxide (ITO). Note that, the material for the pad electrode M3 is not limited to ITO, and may be a transparent conductive film material, for example, a zinc oxide (ZnO) based material such as aluminum doped zinc oxide (AZO) and gallium doped zinc oxide (GZO), or a tin oxide based material.

The terminal QD of the first embodiment is formed so that, in a direction of a plane in which the pad portion PAD is formed, that is, in an in-plane direction of the first substrate SUB1, a gap between the shielding line SH and the pad electrode M3 is smaller than a gap between the wiring SIG and the shielding line SH, which are provided adjacent to each other. As described above, by forming the shielding line SH in the vicinity of the pad electrode M3, the pad electrode M3 whose surface is exposed is protected from an electric field to be applied from the wiring SIG adjacent to the pad electrode M3 by the shielding line SH. In this case, as described in detail later, an insulating film is formed on the shielding line SH, to thereby prevent intrusion of moisture and the like by the insulating film.

That is, in plan view, the pad electrode M3 is surrounded by the shielding line SH having an annular shape (square and annular shape). With this structure, owing to the electric field shielding effect of the shielding line SH, the electric field generated between the wiring SIG and the pad electrode M3, which are provided adjacent to each other, can be blocked. At this time, the shielding line SH and the pad electrode M3 are electrically connected to each other via the wiring SIG1, and hence an electric field is not generated between the shielding line SH and the pad electrode M3. Therefore, the pad electrode M3 can be significantly prevented from corrosion, which progresses due to electric field application to moisture. Thus, the reliability of the terminal QD can be improved.

Meanwhile, an electric field is generated between the wiring SIG and the shielding line SH, which are provided adjacent to each other. However, as described in detail later, the insulating film is formed on the wiring SIG and the shielding line SH, and hence the wiring SIG and the shielding line SH are each covered with the insulating film. Therefore, moisture intrusion is prevented, and hence corrosion of both the shielding line SH and the wiring SIG can be prevented.

Further, in the terminal QD of the first embodiment, the contact holes CH1 and CH2 are formed at side portions of the pad electrode M3, and are each formed into an elongated shape along a side edge portion of the pad electrode M3. By shaping and arranging the contact holes CH1 and CH2 as described above, a flat region is formed in a region SM indicated by a solid line at a center portion of the pad electrode M3, and thus a contact performance with respect to the probe pin is improved. Note that, in the first embodiment, a pair of contact holes CH1 and a pair of contact holes CH2 are formed in four side portions of the square pad electrode M3, and hence the pad electrode M3 is formed into a square shape. However, the shape of the pad electrode M3 may be arbitrarily set, and the forming positions and shapes of the contact holes CH1 and CH2 may also be arbitrarily set, and hence the shape of the flat region SM is not limited to a square shape.

[Detailed Structure of Pad]

Figure 10:
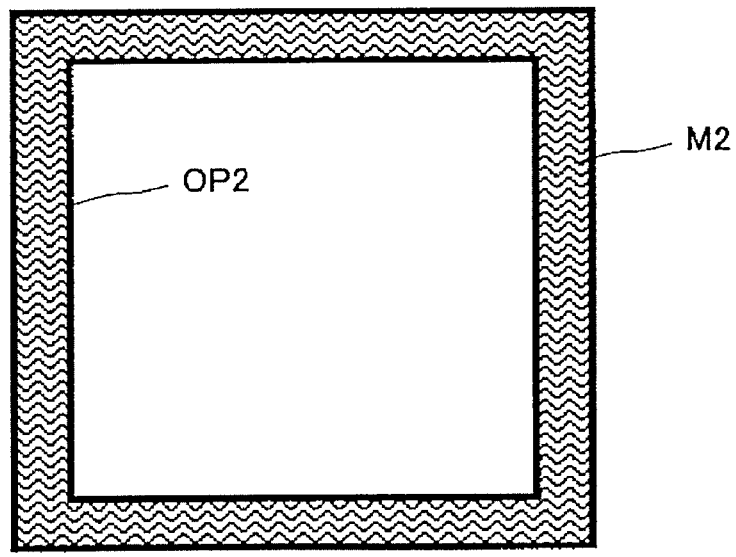
FIG. 10 is a view illustrating a schematic structure of a second conductive thin film forming the terminal of the first embodiment of the present invention.
Figure 11:
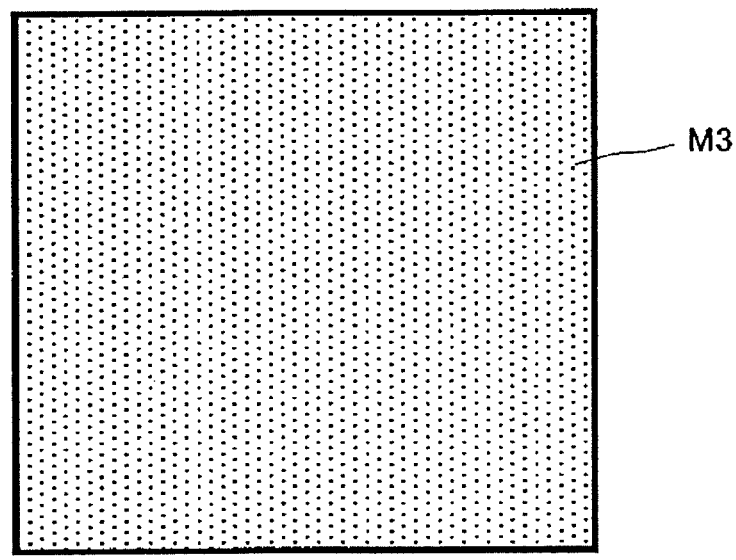
FIG. 11 is a view illustrating a schematic structure of a third conductive thin film forming the terminal of the first embodiment of the present invention.

FIG. 6 is a plan view illustrating a detailed structure of the pad portion of the liquid crystal display device according to the first embodiment of the present invention, FIG. 7 is a sectional view taken along the line VII-VII illustrated in FIG. 6, and FIG. 8 is a sectional view taken along the line VIII-VIII illustrated in FIG. 6. Further, FIG. 9 is a view illustrating a schematic structure of a first conductive thin film forming the terminal of the first embodiment of the present invention, FIG. 10 is a view illustrating a schematic structure of a second conductive thin film forming the terminal of the first embodiment of the present invention, and FIG. 11 is a view illustrating a schematic structure of a third conductive thin film forming the terminal of the first embodiment of the present invention. Hereinafter, with reference to FIGS. 6 to 11, the detailed structure of the pad portion forming the terminal of the first embodiment is described.

As illustrated in FIGS. 7 and 8, the pad portion forming the terminal of the first embodiment includes three conductive thin films which are arranged and overlapped one on top of another through intermediation of insulating films INT1 and INT2. A first conductive thin film layer arranged on the upper surface of the first substrate SUB1 includes, as illustrated in FIG. 9, a first annular electrode (first electrode) M1 having a square and annular shape, specifically, a first annular electrode M1 having a square shape provided along the side portions of the pad electrode M3 and being formed into an annular shape. The first annular electrode M1 is formed in a step of forming a metal thin film for forming a gate electrode of the thin film transistor, and is formed in the same layer as the wirings SIG1 and SIG2 and the shielding line SH. Therefore, the first annular electrode M1 can be formed together with the shielding line SH without adding a new step.

Further, the first annular electrode M1 is formed at the end portion of the wiring SIG1, and is electrically connected to the wiring SIG2 on the lower side in FIG. 9 via the wiring SIG1 and the shielding line SH. That is, in the first embodiment, the shielding line SH and the two wirings SIG1 and SIG2 are electrically connected to each other at different side portions of the pad portion PAD, and the side portions at which the shielding line SH and the two wirings SIG1 and SIG2 are connected to each other are side portions which are formed at opposing positions among the side portions of the pad portion PAD. Note that, the connection portion CN1 at which the first annular electrode M1 and the wiring SIG are electrically connected to each other is provided at one of the two side portions at which the shielding line SH and the wiring SIG are connected to each other. In the first embodiment, the connection portion CN1 is provided at the side portion on the upper side in FIG. 9.

As illustrated in FIGS. 7 and 8, the insulating film (first insulating film) INT1 is formed on the first annular electrode M1, and a second annular electrode (second electrode) M2 is formed on the insulating film INT1. In this case, the second annular electrode M2 is formed so as to overlap the first annular electrode M1 through intermediation of the insulating film INT1. Further, the first annular electrode M1 and the second annular electrode M2 are electrically connected to each other via the contact holes (first contact holes) CH1 formed in the insulating film INT1. In the first embodiment, the contact holes CH1 are formed at opposing side portions, which are side portions (right and left sides in FIG. 6) different from the side portions (upper and lower sides in FIG. 6) to which the wiring SIG and the shielding line SH are connected. With this structure, even when corrosion occurs in the second annular electrode M2, it is possible to delay a time point at which the corrosion reaches the connection portion CN1, that is, a time point at which disconnection between the wiring SIG1 and the shielding line SH and disconnection between the wiring SIG1 and the wiring SIG2 via the shielding line SH occur.

Further, in the first embodiment, the first annular electrode M1 and the second annular electrode M2 are connected to each other via the two contact holes CH1, that is, conductive thin films formed in different layers are connected to each other at at least two positions. With this redundant structure, even when conductive thin films having different corrosion conditions depending on the conductive thin film material are used in the pad portion PAD, a corrosion resistance property can be improved.

Further, as illustrated in FIG. 10, the second annular electrode M2 is formed of a conductive thin film having a square and annular shape. In the first embodiment, the second annular electrode M2 is formed in a step of forming a metal thin film for forming a source electrode and a drain electrode of the thin film transistor, for example.

The insulating film (second insulating film) INT2 is formed on the second annular electrode M2, and the planar pad electrode M3 illustrated in FIG. 11 is formed on the insulating film INT2. In this case, the pad electrode M3 is formed so as to overlap the second annular electrode M2 through intermediation of the insulating film INT2. Further, the second annular electrode M2 and the pad electrode M3 are electrically connected to each other via the contact holes (second contact holes) CH2 formed in the insulating film INT2. In this case, the contact holes CH2 are formed at the same side portions as the side portions (upper and lower sides in FIG. 6) to which the wiring SIG and the shielding line SH are connected. Therefore, even when corrosion occurs in the pad electrode M3 and the corrosion reaches the second annular electrode M2 provided below via the contact holes CH2 to cause corrosion in the second annular electrode M2, it is possible to delay a time point at which the corrosion reaches the first annular electrode M1. The reason is as follows. The contact hole CH1 and the contact hole CH2 are formed at positions rotated by 90°. Further, the first annular electrode M1 and the second annular electrode M2 are formed through intermediation of the insulating film INT1, and the first annular electrode M1 and the second annular electrode M2 have an annular shape. Therefore, the corrosion progressing along the second annular electrode M2 can be prevented from easily reaching the first annular electrode M1 via the contact holes CH2.

As described above, in the liquid crystal display device of the first embodiment, in order to electrically connect the pad electrode M3, which is exposed on the opposing surface side of the first substrate SUB1, and the wirings SIG1 and SIG2 to each other, the wirings SIG1 and SIG2 and the pad electrode M3 are connected to each other via the second annular electrode M2 formed in a layer different therefrom. Further, connection between the second annular electrode M2 and the wirings SIG1 and SIG2, and connection between the second annular electrode M2 and the pad electrode M3 are established via the contact holes CH1 and CH2 respectively formed at different positions in plan view. Therefore, when the liquid crystal display device is used in, for example, a high-temperature and high-humidity environment, it is possible to prevent the corrosion occurring in the pad electrode M3 from easily reaching the wirings SIG1 and SIG2. That is, it is possible to slow down the corrosion occurring in the pad electrode M3 to reach the connection portion between the wiring SIG1 and the shielding line SH, and hence the disconnection between the wiring SIG1 and the wiring SIG2 can be delayed. Thus, the reliability can be improved.

That is, in the liquid crystal display device of the first embodiment, the wiring SIG1 at which the terminal QD is arranged (wiring on the upper side in FIG. 6) is branched into three lines, and the shielding line SH is formed of the wiring lines branched into two opposing directions. In this case, the pad portion PAD is formed between the two shielding lines SH, and the remaining branched wiring line of the wiring SIG1 is connected to the pad portion. Further, the pad portion PAD is annularly surrounded by the two wiring lines (shielding lines SH), which are branched to form the shielding line SH. After that, the two shielding lines SH are coupled so as to be connected to the wiring SIG2. With this structure, the pad portion PAD can be annularly surrounded by the shielding line SH in plan view, and hence it is possible to block the electric field to be applied to the pad portion PAD from the wiring SIG1 adjacent thereto by the shielding line SH. Therefore, when the liquid crystal display device is used in, for example, a high-temperature and high-humidity environment, it is possible to prevent the corrosion from occurring in the pad electrode M3.

Further, the wiring including the terminal QD having the structure of the first embodiment is used for wiring to which a voltage higher than that for another wiring adjacent thereto is to be applied. That is, the terminal QD having the structure of the first embodiment is provided to the wiring to which a voltage higher than that for another wiring adjacent thereto is to be applied. As a result, it is possible to obtain a specific effect that, in wiring formed of a metal thin film, an effect of preventing wiring corrosion due to anode dissolving can be improved.

[Second Embodiment]

Figure 12:
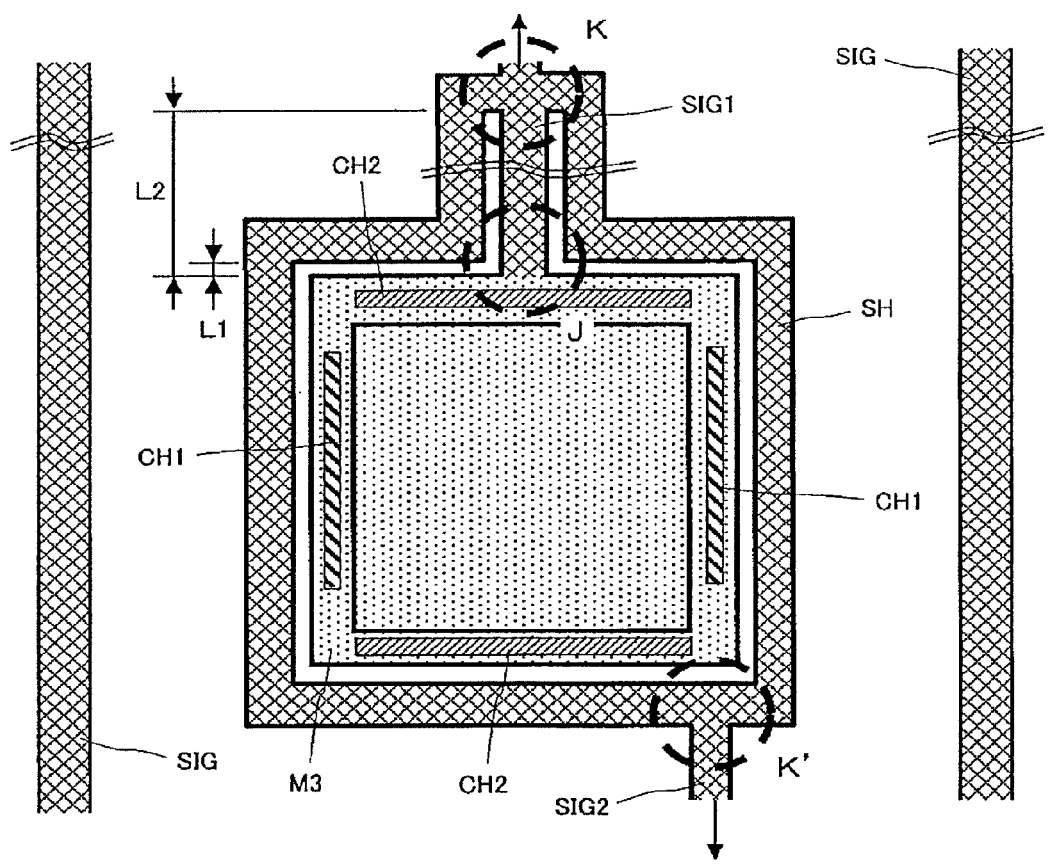
FIG. 12 is a view illustrating a detailed structure of a terminal of a liquid crystal display device corresponding to a display device according to a second embodiment of the present invention.
Figure 13:
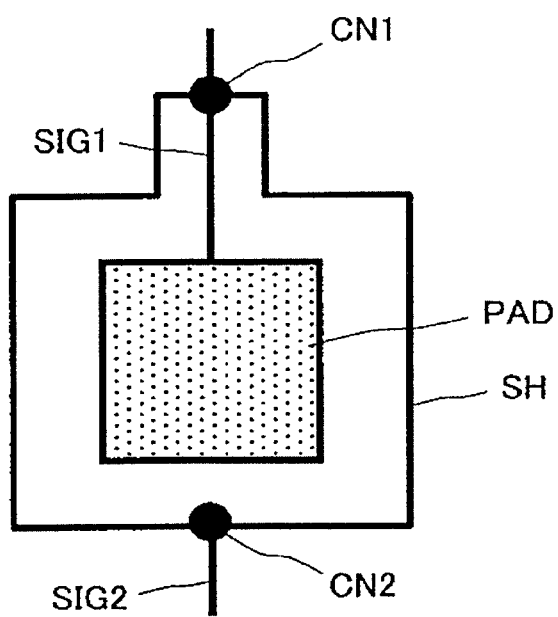
FIG. 13 is a schematic view illustrating the detailed structure of the terminal of the liquid crystal display device according to the second embodiment of the present invention.

FIG. 12 is a view illustrating a detailed structure of a terminal of a liquid crystal display device corresponding to a display device according to a second embodiment of the present invention, and FIG. 13 is a schematic view illustrating the detailed structure of the terminal of the liquid crystal display device according to the second embodiment of the present invention. Hereinafter, with reference to FIGS. 12 and 13, the terminal of the second embodiment is described. Note that, in the terminal QD of the second embodiment, structures other than the connection position of the shielding line SH and the wiring SIG1 and the shape of the shielding line SH are the same as those of the first embodiment. Therefore, in the following description, the shielding line SH is described in detail.

As illustrated in FIGS. 12 and 13, in the terminal QD of the second embodiment, at a portion indicated by a circle J corresponding to an end portion of the wiring SIG1 extended from the upper side in FIGS. 12 and 13, the wiring SIG1 and the pad portion are connected to each other. Further, at a portion indicated by a circle K, that is, at the connection portion CN1, the shielding line SH and the wiring SIG1 are electrically connected to each other. Still further, at a portion indicated by a circle K', that is, at the connection portion CN2, the shielding line SH and the wiring SIG2 are connected to each other. Further, in other regions excluding the connection region with the wiring SIG1, the shielding line SH of the second embodiment is formed into a square and annular shape surrounding the pad portion PAD similarly to the first embodiment. Therefore, also in the terminal QD of the second embodiment, the same effect as that of the first embodiment can be obtained.

Specifically, in the terminal QD of the second embodiment, the connection portion CN1 of the wiring SIG1 and the shielding line SH is formed at a position spaced apart from the pad portion in the in-plane direction of the first substrate SUB1 by a predetermined distance L2. That is, the wiring SIG1 and the shielding line SH are connected to each other at the connection portion CN1 which is spaced apart from a side edge portion of the pad electrode M3 by the distance L2, which is larger than a distance L1 from the side edge portion of the pad electrode M3 to an inner side edge portion of the shielding line SH.

In order to obtain this structure, in the terminal QD of the second embodiment, the shielding line SH is bent in the vicinity of the wiring SIG1 so as to extend in an extension direction of the wiring SIG1, and then the shielding line SH is bent again in the direction toward the wiring SIG1, to thereby connect the shielding line SH to the wiring SIG1. That is, the shielding line SH is provided with a portion extending in a direction in which the wiring SIG1 extends. As a result, in the terminal QD of the second embodiment, even when corrosion occurs in the pad electrode M3, a time point at which the corrosion reaches the connection portion CN1 of the shielding line SH and the wiring SIG1, and the wiring SIG1 and the shielding line SH are electrically disconnected can be more delayed than in the first embodiment, and hence it is possible to obtain a specific effect that the reliability can be further improved.

[Third Embodiment]

Figure 14:
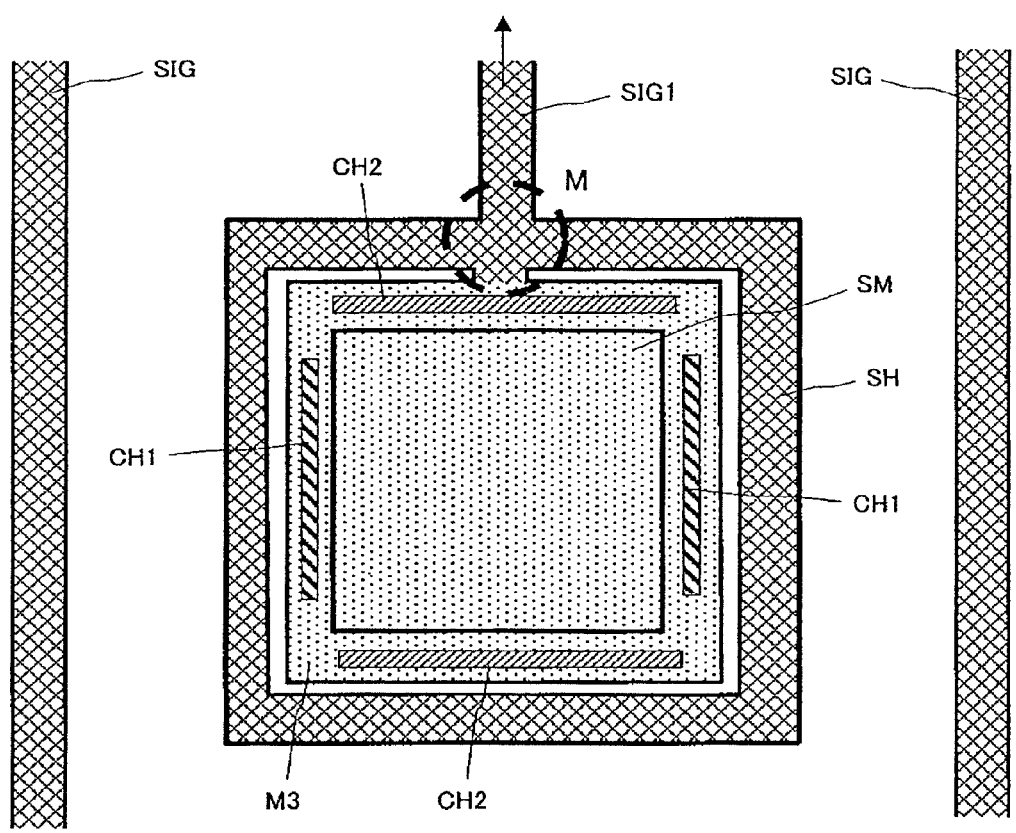
FIG. 14 is a view illustrating a detailed structure of a terminal of a liquid crystal display device corresponding to a display device according to a third embodiment of the present invention.

FIG. 14 is a view illustrating a detailed structure of a terminal of a liquid crystal display device corresponding to a display device according to a third embodiment of the present invention. Hereinafter, with reference to FIG. 14, the terminal of the third embodiment is described. Note that, in the terminal of the third embodiment, structures other than the structure of the wiring connected to the shielding line are the same as those of the first embodiment. Therefore, in the following description, the structures of the shielding line and the wiring are described in detail.

As illustrated in FIG. 14, in the terminal QD of the third embodiment, the pad portion is formed at the end portion of the wiring SIG1 extended from the upper side in FIG. 14, and the shielding line SH and the wiring SIG1 are electrically connected to each other only in a region indicated by a circle M. That is, in the third embodiment, the shielding line SH is supplied with only a signal from the pad electrode M3 or the wiring SIG1, and hence a signal is not input or output to another wiring via the shielding line SH. That is, the shielding line SH does not form an electric passage. Also in this case, the shielding line SH is formed into a square and annular shape so as to surround the pad portion PAD in the in-plane direction of the first substrate SUB1, and hence the same effect as that of the first embodiment can be obtained.

Note that, also when the pad portion is formed to have the structure of the third embodiment, similarly to the second embodiment, the region M in which the wiring SIG1 and the shielding line SH are connected to each other may be formed at a position greatly spaced apart from the pad portion in the in-plane direction of the first substrate SUB1.

[Fourth Embodiment]

Figure 15:
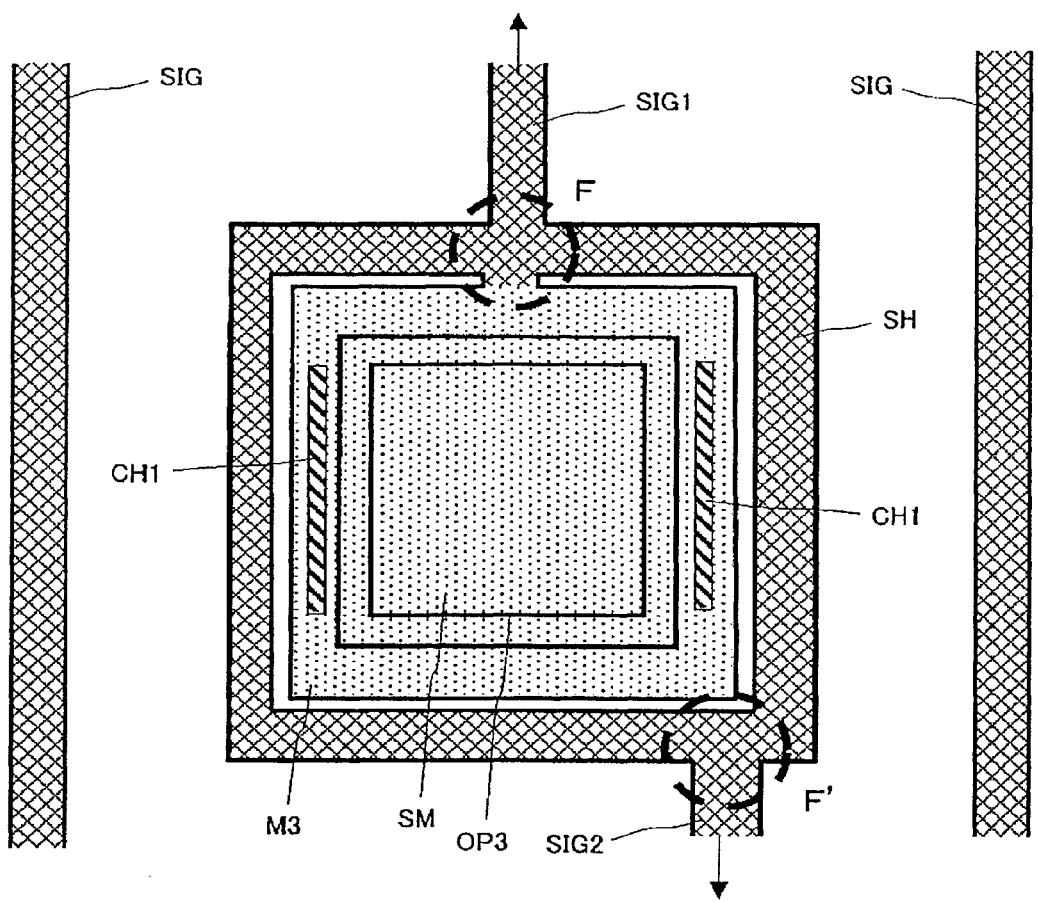
FIG. 15 is a view illustrating a detailed structure of a terminal of a liquid crystal display device corresponding to a display device according to a fourth embodiment of the present invention.

FIG. 15 is a view illustrating a detailed structure of a terminal of a liquid crystal display device corresponding to a display device according to a fourth embodiment of the present invention, and FIG. 16 is a view illustrating a detailed structure of a pad portion of the fourth embodiment of the present invention. Hereinafter, with reference to FIGS. 15 and 16, the terminal of the fourth embodiment is described. Note that, in the terminal of the fourth embodiment, structures other than the structure of the pad portion are the same as those of the first embodiment. Therefore, in the following description, the structure of the pad portion is described in detail.

As illustrated in FIG. 15, also in the terminal of the fourth embodiment, the pad portion is formed within a region surrounded by the shielding line SH having a square and annular shape, and the pad electrode M3 is exposed on the opposing surface side of the first substrate SUB1. Further, the wirings SIG1 and SIG2 and the shielding line SH are formed under the insulating films INT1 and INT2 to be protected. Further, the wirings SIG1 and SIG2 and the shielding line SH are formed of a metal thin film in the same layer. In the upper portion of the pad portion in FIG. 15, the wiring SIG1 and the shielding line SH are connected to each other, and in the lower portion of the pad portion in FIG. 15, the wiring SIG2 and the shielding line SH are connected to each other.

Meanwhile, the contact holes CH1 are formed at two side portions of the four side portions of the pad electrode M3, at which connection portions F and F' of the shielding line SH and the wirings SIG1 and SIG2 are not arranged. Further, in a region including a center region of the pad electrode M3, an opening portion OP3 is formed, which functions as a contact region (third contact hole) for electrically connecting an electrode provided below and the pad electrode M3 to each other.

FIG. 17 is a sectional view taken along the line XVII-XVII illustrated in FIG. 16, and FIG. 18 is a sectional view taken along the line XVIII-XVIII illustrated in FIG. 16. Hereinafter, with reference to FIGS. 15 to 18, the detailed structure of the pad portion of the fourth embodiment is described.

As illustrated in FIGS. 17 and 18, the pad portion of the fourth embodiment also includes the first annular electrode M1, which is formed on the surface of the first substrate SUB1 and has a square and annular shape, and the second annular electrode M2, which is formed so as to overlap the first annular electrode M1 through intermediation of the insulating film INT1. The pad portion of the fourth embodiment further includes a planar electrode (fourth electrode) M4, which is formed into a planar shape on the second annular electrode M2 so that a side portion thereof overlaps the second annular electrode M2, and the pad electrode M3, which is formed so as to overlap the planar electrode M4 through intermediation of the insulating film INT2.

In this case, as illustrated in FIG. 17, the first annular electrode M1 and the second annular electrode M2 are electrically connected to each other via the contact holes CH1 formed in a region of the insulating film INT1 which overlaps the first annular electrode M1. Further, as illustrated in FIGS. 17 and 18, the planar electrode M4 is formed on the second annular electrode M2, and hence in a region in which the planar electrode M4 overlaps the second annular electrode M2, that is, at the side portion of the planar electrode M4, the second annular electrode M2 and the planar electrode M4 are electrically connected to each other. Still further, the insulating film INT2 is formed on the planar electrode M4, and via the opening portion OP3 formed in this insulating film INT2, the planar electrode M4 and the pad electrode M3, which is formed on the insulating film INT2, are electrically connected to each other.

Note that, the planar electrode M4 is made of ITO, which is a transparent conductive film material, similarly to the pad electrode M3, but the planar electrode M4 and the pad electrode M3 are formed in different steps. For example, when forming an IPS type liquid crystal display panel, the planar electrode M4 is formed in a step of forming the pixel electrode, which is carried out after forming the drain electrode and the source electrode of the thin film transistor, and the pad electrode M3 is formed in a step of forming the common electrode. Therefore, the pad portion can be formed without increasing the number of manufacturing steps. Note that, the steps of forming the planar electrode M4 and the pad electrode M3 are not limited to the above-mentioned steps, and the planar electrode M4 and the pad electrode M3 may be formed in other steps. Further, the material for the planar electrode M4 is not limited to ITO, and the planar electrode M4 may be formed of a conductive thin film material made of other oxide compounds.

In the liquid crystal display device of the fourth embodiment having the above-mentioned structure, similarly to the first embodiment, the first annular electrode M1 is protected by the insulating film INT1, whereas the second annular electrode M2 is protected by the planar electrode M4. Further, the side portion of the planar electrode M4 is protected by the insulating film INT2, and the pad electrode M3 protects the center portion as well as the side portion of the planar electrode M4.

As described above, also in the liquid crystal display device of the fourth embodiment, there are formed the first annular electrode M1, which is formed at the end portion of the wiring SIG1 and extends in the in-plane direction of the first substrate SUB1, and the second annular electrode M2, which extends in the in-plane direction of the first substrate SUB1 and provided above the first annular electrode M1 through intermediation of the insulating film INT1 covering the first annular electrode M1. Further, there are formed the planar electrode M4, which is formed on the second annular electrode M2 and extends in the in-plane direction of the first substrate SUB1, and the pad electrode M3 provided above the planar electrode M4 through intermediation of the insulating film INT2 covering the planar electrode M4. In this case, the contact holes CH1 for electrically connecting the first annular electrode M1 and the second annular electrode M2 to each other, the second annular electrode M2 overlapping the first annular electrode M1 through intermediation of the insulating film INT1, and the opening portion OP3 for electrically connecting the planar electrode M4 and the pad electrode M3 to each other, the pad electrode M3 overlapping the planar electrode M4 through intermediation of the insulating film INT2, are formed at positions shifted in the in-plane direction of the first substrate SUB1. Therefore, in addition to the effect of the first embodiment described above, it is possible to further delay a time point at which the corrosion occurring in the pad electrode M3, which occurs when the liquid crystal display device is used in, for example, a high-temperature and high-humidity environment, reaches the wirings SIG1 and SIG2. As a result, the reliability can be further improved.

[Fifth Embodiment]

FIGS. 19A, 19B, 20A, 20B, and 20C are views each illustrating a structure of a shielding line forming a terminal of a display device according to a fifth embodiment of the present invention. Specifically, FIGS. 19A, 19B, 20A, 20B, and 20C are views each illustrating a structure of a terminal in which wiring is connected to one end portion of the shielding line formed into a C-shape. Note that, FIGS. 19A, 19B, 20A, 20B, and 20C are schematic views illustrating a detailed structure of the terminal of the fifth embodiment, which correspond to FIGS. 5 and 13 illustrating the first embodiment and the second embodiment.

In the first to fourth embodiments described above, the periphery of the pad portion is annularly surrounded by the annular shielding line SH provided along the outer shape of the pad portion. However, in the terminal of the fifth embodiment, the shielding line SH is formed into a non-annular shape in which the shielding line SH formed around the pad portion is disconnected in part, that is, into a C-shape, and the C-shaped shielding line SH surrounds the periphery of the pad portion. That is, the shielding line SH of the first to fourth embodiments includes two line passages from the wiring SIG1 to the wiring SIG2 via the shielding line SH, but the shielding line SH of the fifth embodiment includes only one wiring line passage from the wiring SIG1 to the wiring SIG2 via the shielding line SH.

Figure 19A:
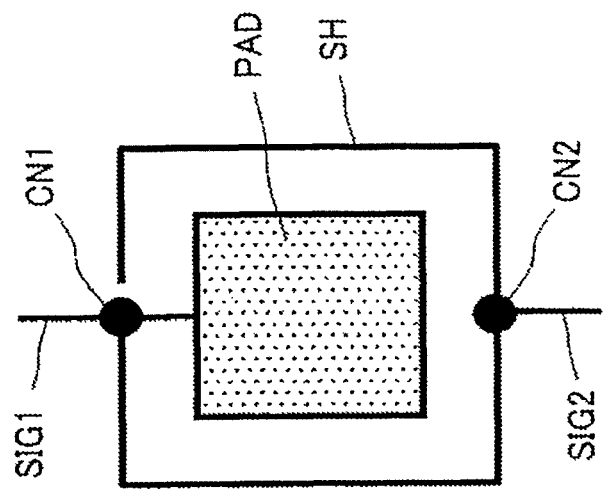
FIGS. 19A and 19B are views each illustrating a structure of a shielding line forming a terminal of a display device according to a fifth embodiment of the present invention.

In the structure illustrated in FIG. 19A, the shielding line SH is spaced apart from the side edge portion of the pad portion PAD by a predetermined distance, and is formed into a C-shape forming a square in which a part of the shielding line SH is lacking at the side portion on the lower side in FIG. 19A. That is, the shielding line SH has a shape in which a part of the shielding line SH of the first embodiment, which is formed into a square and annular shape, is lacking, and specifically, open ends of the shielding line SH are formed on a side on which the wiring SIG2 is formed. Specifically, in the structure illustrated in FIG. 19A, one end of the C-shaped shielding line SH is connected to the wiring SIG2 at the connection portion CN2, and the shielding line SH is electrically connected to the wiring SIG1 at the connection portion CN1 in the middle of the extension portion of the shielding line SH. Further, the shielding line SH is extended so that another end thereof is formed in the vicinity of the connection portion CN2 and the shielding line SH is opened at the another end. Note that, the connection portion CN2 at which the wiring SIG2 and the shielding line SH are connected to each other is not limited to the end portion of the shielding line SH, and may be the extension portion of the shielding line SH.

Also in the terminal having such a structure, the shielding line SH is arranged between the pad portion PAD and the wiring SIG adjacent thereto, and the voltage of the shielding line SH becomes the same as the voltage of the pad portion PAD. Therefore, it is possible to obtain the same effect as that of the first embodiment. Note that, in the structure of the shielding line SH illustrated in FIG. 19A, the wiring SIG1 and the wiring SIG2 are electrically connected to each other only via a part of the shielding line SH on the left side of the pad portion PAD in FIG. 19A.

Figure 19B:
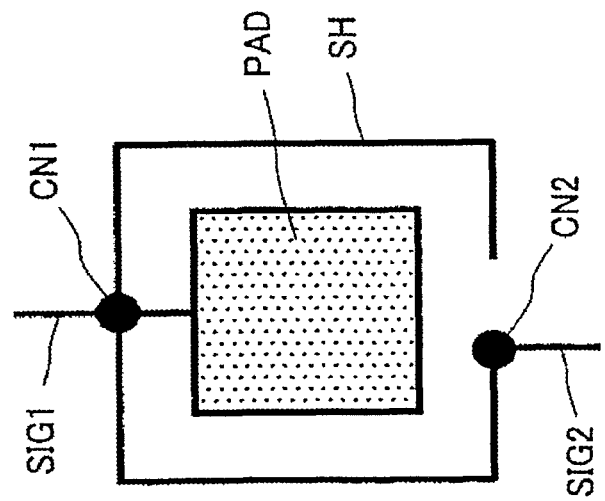

Further, the shielding line SH illustrated in FIG. 19B has a C-shape similarly to the shielding line SH illustrated in FIG. 19A, and specifically, open ends thereof, at which a part of the shielding line SH is lacking, are arranged on a side on which the wiring SIG1 is formed. That is, in the structure illustrated in FIG. 19B, one end of the C-shaped shielding line SH is connected to the wiring SIG1 at the connection portion CN1, and the shielding line SH is electrically connected to the wiring SIG2 at the connection portion CN2 in the middle of the extension portion thereof. Further, the shielding line SH is extended so that another end thereof is opened in the vicinity of the connection portion CN1. Also in this structure, the shielding line SH is arranged between the pad portion PAD and the wiring SIG adjacent thereto, and the voltage of the shielding line SH becomes the same as the voltage of the pad portion PAD. Therefore, it is possible to obtain the same effect as that of the first embodiment. Note that, the connection portion CN1 at which the wiring SIG1 and the shielding line SH are connected to each other is not limited to the end portion of the shielding line SH, and may be the extension portion of the shielding line SH.

Figure 20C:
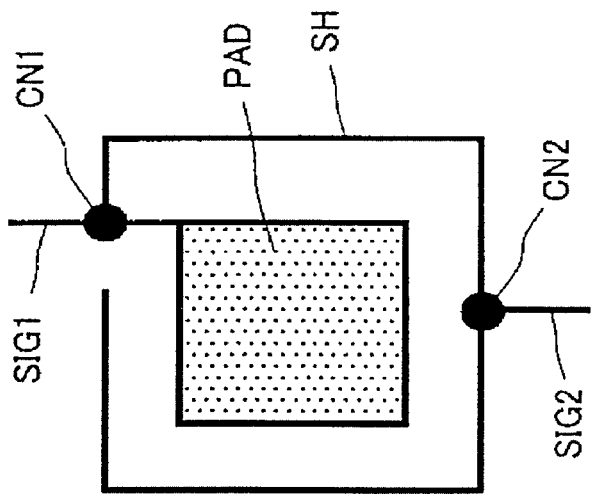
FIGS. 20A, 20B, and 20C are views each illustrating a structure of a shielding line forming the terminal of the display device according to the fifth embodiment of the present invention.
Figure 20B:
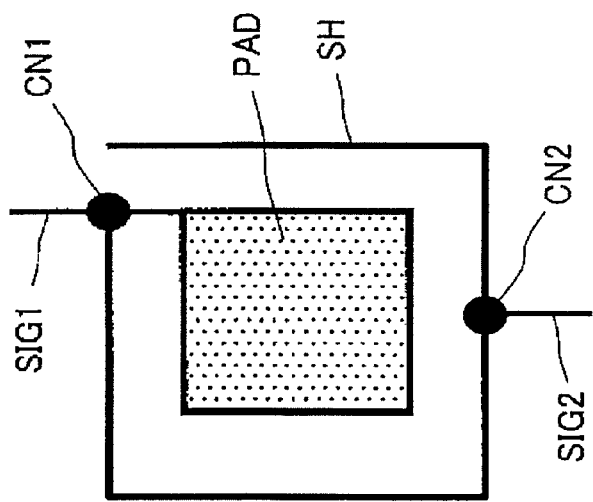
Figure 20A:
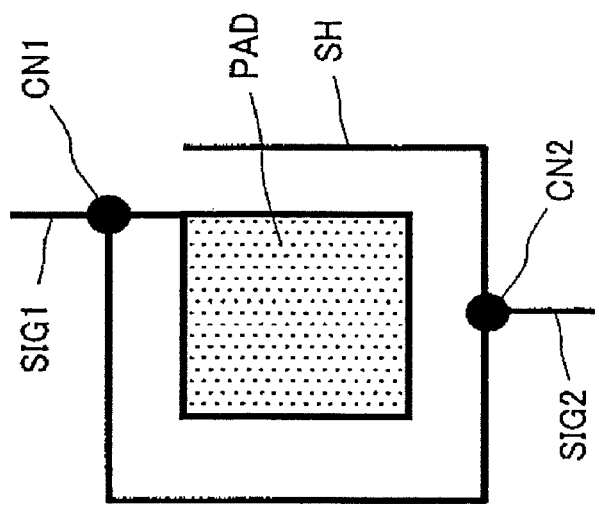

Meanwhile, in the structures of the terminals illustrated in FIGS. 20A to 20C, the shielding line SH is formed into a C-shape forming a square along the side portions of the pad portion PAD, and at a corner portion of the pad portion PAD, the shielding line SH is connected to the wiring SIG1.

In the terminal illustrated in FIG. 20A, the wiring SIG1 and the pad portion PAD are electrically connected to each other at the corner portion of the pad portion PAD. Further, one end of the shielding line SH is electrically connected to the wiring SIG1 at the connection portion CN1, the shielding line SH being arranged so as to be opposed to a side edge portion of two side edge portions of the pad portion PAD sharing the corner portion, the side edge portion being extended in a direction not matching the extension direction of the wiring SIG1, that is, the side edge portion intersecting the wiring SIG1. Another end of the shielding line SH is opened in the vicinity of the corner portion. In this case, in the terminal illustrated in FIG. 20A, the one end and the another end of the shielding line SH are formed so as not to extend beyond the extended lines of the side edge portions of the pad portion PAD, which share the corner portion at which the wiring SIG1 and the pad portion PAD are connected to each other. Also in this structure, the shielding line SH is arranged between the pad portion PAD and the wiring SIG adjacent thereto, and the shielding line SH is applied with the same voltage as that for the pad portion PAD. Therefore, it is possible to obtain the same effect as that of the first embodiment.

Further, the terminal illustrated in FIG. 20B only differs from that illustrated in FIG. 20A in that the another end portion of the shielding line SH, which does not connect to the wiring SIG1, is formed so as to extend beyond one of the extended lines of the side edge portions of the pad portion PAD, which share the corner portion at which the wiring SIG1 and the pad portion PAD are connected to each other. Therefore, also in the terminal illustrated in FIG. 20B, similarly to the terminal illustrated in FIG. 20A described above, it is possible to obtain the same effect as that of the first embodiment.

Further, in the terminal illustrated in FIG. 20C, the wiring SIG1 and the pad portion PAD are electrically connected to each other at the corner portion of the pad portion PAD. Further, also in the terminal illustrated in FIG. 20C, the shielding line SH is formed in the periphery of the pad portion PAD so as to surround the pad portion PAD, and open ends are formed at the side portion on a side on which the wiring SIG1 is arranged. One end portion corresponding to one of the open ends of the shielding line SH on a side near a connection position of the pad portion PAD and the wiring SIG1 is electrically connected to the wiring SIG1 at the connection portion CN1, and another end portion is opened in the vicinity of the connection portion CN1. In this case, as illustrated in FIG. 20C, when the shielding line SH and the wiring SIG2 are connected to each other at the connection portion CN2 positioned at a center part of the side portion on the lower side in FIG. 20C, a distance between the connection portion CN1 and the connection portion CN2 can be reduced. Therefore, in addition to the effect of the first embodiment described above, it is possible to obtain an effect that the part of the shielding line SH used for electrically connecting the wiring SIG1 and the wiring SIG2 to each other can be shortened.

Further, the terminals of the first to fourth embodiments may also be structured so that the wiring SIG1 and the pad portion are electrically connected to each other at the corner portion of the pad portion.

Note that, in the display devices according to the first to fifth embodiments, description has been made of a case where a conductive thin film having a square and annular shape is used to form the first annular electrode M1 and the second annular electrode M2. However, similarly to the shielding line SH of the fifth embodiment, the first annular electrode M1 and/or the second annular electrode M2 may be a linear electrode formed into a C-shape in which a part thereof is lacking.

Further, in the display devices according to the first to fifth embodiments, the wiring SIG and the shielding line SH are formed of a metal thin film in the same layer, but the present invention is not limited thereto. The shielding line SH may be formed of a conductive thin film formed in a layer different from a layer in which the wiring SIG is formed. Note that, in the embodiments, the wiring SIG1 and the wiring SIG2 are electrically connected to each other via the shielding line SH, and hence it is preferred that the shielding line SH be formed of a metal thin film having a small sheet resistance. With use of a metal thin film to form the shielding line SH, it is possible to reduce a resistance value of the entire wiring electrically connected via the shielding line SH, and thus a signal delay and the like can be reduced.

Still further, the display devices according to the first to fifth embodiments may be combined as appropriate.

The present invention made by the inventors is specifically described in the above based on the embodiments of the present invention, but the present invention is not limited to the embodiments above and various modifications are possible which fall within the gist of the present invention.

What is claimed is:

1. A display device comprising:
   a transparent substrate;
   a display region in which a plurality of scanning signal lines and a plurality of video signal lines intersecting the plurality of scanning signal lines are formed on the transparent substrate; and
   a first conductive layer on the transparent substrate, a second conductive layer on the first conductive layer, and a third conductive layer on the second conductive layer,
   wherein a first terminal is formed outside the display region on the transparent substrate and connects to a first terminal wiring and a second terminal wiring electrically connecting to a semiconductor chip;
   wherein the first terminal comprises the first conductive layer, the second conductive layer, the third conductive layer having an exposed planar terminal on the second conductive layer, a plurality of first vias each of which is connected between the first conductive layer and the second conductive layer, and a plurality of second vias each of which is connected between the second conductive layer and the third conductive layer,
   wherein the first conductive layer has a first region overlapped with the third conductive layer and a second region not overlapped with the third conductive layer,
   wherein the first conductive layer has a slit between the first region and the second region in plan view,
   wherein the second region connects to the first terminal wiring and the second terminal wiring, and
   wherein each of the plurality of first vias is not overlapped with each of the plurality of second vias in plan view.

2. The display device according to claim 1, further comprising:
   a second terminal which is formed outside the display region on the transparent substrate and connects to a third terminal wiring and a fourth terminal wiring electrically connected to the semiconductor chip; and
   wherein a first width of the first terminal wiring is narrower than a third width of the third terminal wiring, and a second width of the second terminal wiring is narrower than a fourth width of the fourth terminal wiring.

3. The display device according to claim 2, wherein the first terminal supplies a signal for one of the plurality of scanning signal lines and the plurality of video signal lines to the first terminal wiring, and the second terminal supplies a common signal or a power supply to the display region.

4. The display device according to claim 2, further comprising:
   a first insulation film which is formed between the first and second conductive layers of the first terminal, and a second insulation film which is formed between the second and third conductive layers of the first terminal,
   wherein the second terminal comprises a fourth conductive layer on the transparent substrate, a fifth conductive layer on the fourth conductive layer, a sixth conductive layer having an exposed planar terminal on the fifth conductive layer, a plurality of third vias each of which is connected between the fourth conductive layer and the fifth conductive layer, and a plurality of fourth vias each of which is connected between the fifth conductive layer and the sixth conductive layer;
   wherein the fourth conductive layer is electrically connected with the third and fourth terminals wirings;
   wherein each of the plurality of third vias is not overlapped to each of the plurality of fourth vias in plan view; and
   wherein the plurality of first vias and the plurality of third vias are formed in the first insulation film, and the plurality of second vias and the plurality of fourth vias are formed in the second insulation film.

5. The display device according to claim 1,
   wherein the first terminal is composed of the first conductive layer, the second conductive layer, and the third conductive layer.

6. The display device according to claim 1, further comprising:
   an inverted staggered thin film transistor on the transparent substrate.

7. The display device according to claim 1,
   wherein a material of the third conductive layer is indium tin oxide.

8. The display device according to claim 1, further comprising:
   wherein the first conductive layer constitutes the second terminal wiring.

* * * * *